United States Patent [19]

Ishikawa

[11] Patent Number: 5,270,228
[45] Date of Patent: Dec. 14, 1993

[54] METHOD OF FABRICATING GATE ELECTRODE IN RECESS

[75] Inventor: Takahide Ishikawa, Itami, Japan
[73] Assignee: Mitsubishi Denki Kabushiki Kaisha, Tokyo, Japan
[21] Appl. No.: 745,333
[22] Filed: Aug. 15, 1991

[30] Foreign Application Priority Data

Feb. 14, 1991 [JP] Japan .................................. 3-44243

[51] Int. Cl.⁵ .................... H01L 21/265; H01L 21/44
[52] U.S. Cl. ........................................ 437/39; 437/41; 437/133; 437/184; 437/203
[58] Field of Search .............. 437/39, 228, 203, 59, 437/184, 185, 40, 41, 947; 357/22; 148/DIG. 161

[56] References Cited

U.S. PATENT DOCUMENTS

| | | | |
|---|---|---|---|
| 4,719,498 | 1/1988 | Wada et al. | 357/40 |
| 4,733,283 | 3/1988 | Kuroda | 357/41 |
| 4,849,368 | 7/1989 | Yamashita et al. | 437/184 |
| 4,927,782 | 5/1990 | Davey et al. | 437/126 |
| 5,110,765 | 5/1992 | Bilakanti et al. | 437/225 |

FOREIGN PATENT DOCUMENTS

| | | | |
|---|---|---|---|
| 0087251 | 8/1983 | European Pat. Off. | |
| 0283278 | 9/1988 | European Pat. Off. | |
| 0303248 | 2/1989 | European Pat. Off. | |
| 0371686 | 6/1990 | European Pat. Off. | 437/40 |
| 56-61169 | 5/1981 | Japan | 437/40 |
| 60-240130 | 11/1985 | Japan | 148/DIG. 161 |
| 61-89681 | 5/1986 | Japan . | |
| 62-122276 | 6/1987 | Japan | 437/40 |
| 62-176171 | 8/1987 | Japan | 437/40 |
| 63-228761 | 9/1988 | Japan | 437/40 |
| 64-7664 | 1/1989 | Japan . | |
| 1-223771 | 9/1989 | Japan . | |
| 1-286369 | 11/1989 | Japan . | |
| 0199825 | 8/1990 | Japan | 437/128 |
| 8504761 | 10/1985 | PCT Int'l Appl. . | |
| 2125621 | 3/1984 | United Kingdom . | |
| 3706274 | 9/1987 | United Kingdom | 357/22 |

OTHER PUBLICATIONS

Igi et al, "High Power and High Efficiency GaAs FET's in C-Band", IEEE MTT International Microwave Symposium Digest, vol. 1, 1988, pp. 1/4-4/4.

Primary Examiner—Olik Chaudhuri
Assistant Examiner—Loc Q. Trinh
Attorney, Agent, or Firm—Leydig, Voit & Mayer

[57] ABSTRACT

A method of fabricating a field effect transistor in which the gate electrode is formed in a multiple step recess including a first recess located on one level and a second recess located on a lower level. The second, narrower recess is nested in the first, wider recess. The method is initiated by growing a first semiconductor layer of a low etch rate on a semiconductor substrate. Then, a second semiconductor layer of a high etch rate is grown on the first semiconductor layer. A resist film having an opening in a selected location is formed on the second semiconductor layer. Using this resist film as a mask, the semiconductor layers are selectively etched. The gate electrode is formed at the bottom of the multiple step recess created by the etching.

12 Claims, 7 Drawing Sheets

METHOD OF FABRICATING GATE ELECTRODE IN RECESS

FIELD OF THE INVENTION

The present invention relates to a method of fabricating a semiconductor device and, more particularly, to a method of fabricating a field-effect transistor having a gate structure provided with recesses on different levels, i.e., having gate electrodes each disposed in a hole that is created by forming an upper wider recess and a lower narrower recess in the same location in the surface of a semiconductor layer.

BACKGROUND OF THE INVENTION

Referring to FIG. 8, a MESFET having the conventional gate structure having two recesses on different levels, i.e., a two-stage recess, is shown in cross section. This FET has a GaAs substrate 1 and an n-type GaAs active layer 2 formed on the substrate 1. A first recess 6 is formed in a given location in the active layer 2. A second recess 5 is formed in the center of the bottom surface of the first recess 6. Thus, a hole 20 is formed by the upper wider recess 5 and the lower narrower recess 6.

A gate electrode 4 is located in the center of the bottom surface of the second lower recess 5 and in Schottky contact with the active layer 2. The gate electrode 4 is formed by successively depositing a layer of titanium, a layer of platinum, and a layer of gold (none of which are shown) on the active layer 2. A source electrode 3a and a drain electrode 3b are formed on opposite sides of the hole 20 consisting of the two recesses, and are in ohmic contact with the active layer 2.

MESFETs of this doubly recessed gate structure have enjoyed wide acceptance as high-output transistors. They are characterized by small consumption of electric power and a high power efficiency. The power efficiency of a MESFET is the ratio of the electric power supplied from the power supply to the device to the output power from the device, and is given by $$(P_{OUT} - P_{IN})/(V_{DD} \times I_{DD})$$

where $V_{DD}$ is the potential applied to the device from the power supply, $I_{DD}$ is the current flowing between the source and the drain, $P_{OUT}$ is the output power, and $P_{IN}$ is the input power, as shown in FIG. 11.

The doubly recessed gate structure produces a smaller source-drain resistance and thus provides a higher power efficiency than FETs having a singly recessed gate structure and FETs having no recess. It is considered today that this advantage of the doubly recessed structure arises from the fact that the resistive component between the source and the drain is smaller than that of the singly recessed structure.

This MESFET is fabricated in the manner described now. First, as shown in FIG. 9(a), the n-type active layer 2 consisting of the same material as the GaAs substrate 1 is formed on the substrate 1 by ion implantation or epitaxy. The GaAs substrate may be replaced by a substrate of Si or InP. In this case, the active layer is an n-type Si layer or n-type InP layer. The source electrode 3a and the drain electrode 3b which should make ohmic contact with the active layer 2 are photolithographically formed on opposite sides of the region of the active layer 2 that is to be doubly recessed.

Then, as shown in FIG. 9(b), a resist pattern 7 is formed by photolithography. In particular, the resist film 7 is formed over the whole surface of the active layer 2. An opening 7a is formed between the source electrode 3a and the drain electrode 3b by exposure and development. Thereafter, using this resist pattern 7 as a mask, the active layer 2 is etched by an appropriate method, for example, reactive ion etching (RIE) or wet chemical etching. In this way, the first recess 6 is formed in the active layer 2 (FIG. 9(c)).

After removing the resist pattern 7, a resist pattern 8 having an opening 8a in the center of the first recess 6 is formed by photolithography in the same way as in the foregoing process (FIG. 9(d)). Using the resist pattern 8 as a mask, the active layer 2 is etched to form the second recess 5 (FIG. 9(e)).

Then, the material of the gate electrode is deposited over the whole surface of the laminate, and the gate electrode 4 is formed by the lift-off technique. In this example, the Ti layer is deposited to a thickness of 1000 angstroms, the Pt layer is deposited to a thickness of 1000 angstroms, and the Au layer is deposited to a thickness of 3000 angstroms (FIG. 10(a)). Subsequently, the resist pattern 8 is removed, forming the gate electrode 4 in the second recess 5 within the hole 20 (FIG. 10(b)).

In the above-described fabrication method, the two recesses are formed one after another. This process is complicated and requires a long time to be carried out. Furthermore, the manufacturing yield is low.

More specifically, the formation of each at the recesses 5 and 6 needs a lithography step. Therefore, and an etching step therefore it takes long to form the two recesses. In addition, it is very difficult to correctly place the second recess 5 within the first recess 6. Actually, the second recess often fails to nest in the first recess. This is one major factor providing a low manufacturing yield.

Japanese Patent Publication No. 1-286369 discloses a method of fabricating MESFETs having different threshold values on the same substrate. Specifically, semiconductor layers of dissimilar etch rates are grown on top of each other to form channel regions. The upper semiconductor layer is selectively etched, using a first mask, to expose selected portions of the lower semiconductor layer of an etch rate different from that of the upper layer. Under this condition, a second mask having openings corresponding to the selected portions of the upper semiconductor layer and to the exposed portions of the lower semiconductor layer is formed. The semiconductor layers exposed in the openings of the mask are etched in such a way that one of the two semiconductor layers remains unetched in one etching step. However, this method is unsuccessful in solving the problem of the alignment of the two masks. Also, the number of etching steps cannot be reduced.

Japanese Patent Publication No. 64-7664 discloses a method of fabricating a field-effect transistor having the doubly etched structure. In this method, a layer to be etched is selectively implanted with ions to vary the etch rate of the selected portions of the etched layer. Thus, the doubly recessed structure is formed by its self-aligning characteristic in one etching step. In this method, however, the boundary between the implanted region and the region not implanted is not sharp. Therefore, it is difficult to control the profiles of the recesses. In addition, it is impossible to form a structure having three or more recesses on different levels.

Moreover, in this method, the second recessed region has a higher etch rate than that of the first recessed region and so etching of these two regions must be started simultaneously. That is, a mask having openings corresponding to the feature of the second recessed region is needed during ion implantation. In addition, a mask having openings corresponding to the first recessed region is required during etching. A mask fabrication process using an undercutting procedure is necessitated to form the latter mask.

Japanese Patent Publication No. 1-223771 discloses a further method of fabricating the doubly recessed structure. In particular, an insulating film is formed on the channel region of a semiconductor layer having source and drain electrodes thereon. A photoresist layer having openings corresponding to the second recessed region is formed on the insulating film. Using the photoresist layer as a mask, the insulating film is anisotropically etched and then the semiconductor layer is etched to a given depth. Subsequently, the insulating film is undercut. Using this insulating film as a mask, an etching step is carried out to form the first recess. In this method, it is necessary to form only one resist mask. Nonetheless, the mask is required to be undercut in the same way as in the process described in the above-cited Japanese Patent Publication No. 64-7664. Furthermore, the process is quite complex, because plural etching techniques must be employed.

SUMMARY OF THE INVENTION

It is an object of the invention to provide a method of fabricating a semiconductor device in such a way that a structure having recesses on different levels is formed in one lithography step and in one etching step without an extra mask fabrication step, and that nesting of the recesses on the different levels is effected, utilizing a self-aligning characteristic of the recessed semiconductor layer.

A method of fabricating a semiconductor device in accordance with the present invention comprises the steps of: forming a semiconductor layer on a semiconductor substrate in such a way that the etch rate decreases with depth in the semiconductor layer; forming a resist film having an opening at selected position on the semiconductor layer and etching the semiconductor layer, using the resist film as a mask; and forming a gate electrode at the bottom of the recess formed by the etching. The upper portion of each recess is wider than the lower portion. The recess of this construction can be fabricated in one lithography step and in one etching step without an extra mask fabrication step.

In one embodiment of the invention, the step of forming a semiconductor layer on a semiconductor substrate includes forming a first semiconductor layer of a low etch rate on the semiconductor substrate and then forming a second semiconductor layer of a high etch rate on the first semiconductor layer. The step of forming a resist film and etching the semiconductor layer includes selectively etching away the second and first semiconductor layers to form a two-stage concave recess in the opening formed in the resist film. The two recesses can be formed in one lithography step. In addition, the nesting of the holes forming each individual recess can be effected by the self-aligning characteristics of the semiconductor layers. Since the upper recessed layer has a higher etch rate than that of the lower recessed layer, only one mask having openings corresponding to the feature of the lower recessed layer is needed to obtain a mask that is used to produce the doubly recessed structure; no extra mask is necessary.

In another embodiment of the invention, the step of forming a semiconductor layer on a semiconductor substrate includes successively growing three or more semiconductor layers of dissimilar etch rates on the semiconductor substrate such that the etch rate of the formed laminate decreases with depth. The step of forming a resist film and etching the semiconductor layer includes selectively removing these semiconductor layers to form recesses of substantially inverted triangular cross section in the opening in the resist film. The width of each recess increases upwardly in a stepwise fashion. Thus, a multi-recessed structure having a nearly conical form which is recognized as providing the best power efficiency can be easily manufactured.

In a further embodiment of the invention, the step of forming a semiconductor layer on a semiconductor substrate comprises growing the semiconductor layer in such a way that the etch rate increases continuously from the lower surface to the upper surface. The step of forming a resist film and etching the semiconductor layer comprises etching the semiconductor layer to form a conical recess in the opening in the resist film. Thus, a recessed structure having the conical recess which is recognized as providing the best power efficiency can be easily manufactured.

Other objects and features of the invention will appear in the course of the description thereof which follows.

BRIEF DESCRIPTION OF THE DRAWINGS

FIGS. 3(a)-1(b) are cross-sectional views illustrating the steps performed to create a gate electrode of the MESFET shown in FIGS. 1(a)-1(c);

DETAILED DESCRIPTION OF THE INVENTION

Figure 1A:
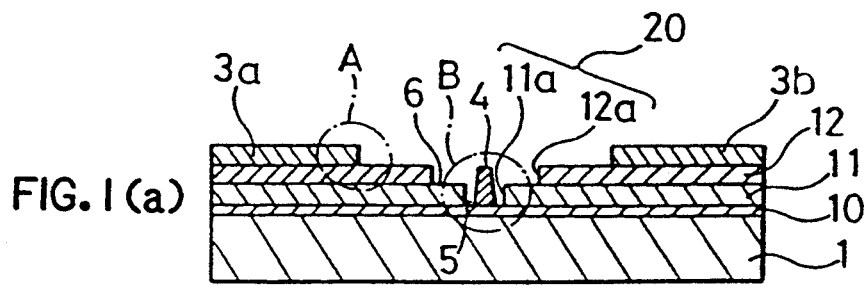
FIGS. 1(a)-1(c) are cross-sectional views of a MESFET fabricated by a method according to the invention, the MESFET having a doubly recessed gate structure.
Figure 1B:
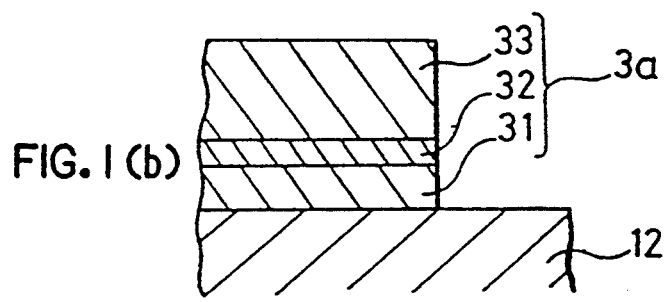
Figure 1C:
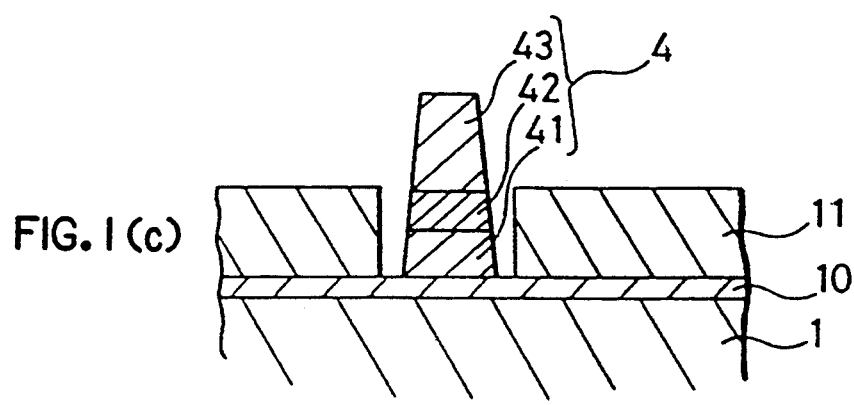

Referring to FIGS. 1(a)-1(c), there is shown a MESFET fabricated by a method according to the invention. FIG. 1(a) is a cross section of the MESFET. FIG. 1(b) is a cross section of portion A of FIG. 1(a), showing the source and the drain electrodes. FIG. 1(c) is a cross section of portion B of FIG. 1(a), showing the cross section of the gate electrode. A channel layer 10 consisting of an n-type GaAs layer is formed on a GaAs substrate 1. A lower semiconductor layer 11 to be recessed is formed on the channel layer 10. This semiconductor layer 11 is an n+-type AlGaAs layer. An upper semiconductor layer 12 to be recessed is formed on the lower semiconductor layer 11. This upper layer 12 is an n+-type GaAs layer. An opening 12a is formed in a selected location in the upper semiconductor layer 12. Another opening 11a is formed in the lower semiconductor layer 11 in the center of the upper opening 12a. These openings 12a and 11a form a first recess 6 and a second recess 5, respectively, which are on different levels. In this way, a double recess 20 is formed.

A source electrode 3a and a drain electrode 3b are formed on the upper semiconductor layer 12 on opposite sides of the double recess 20 and make ohmic contact with the upper semiconductor layer 12. As shown in FIG. 1(b), the source electrode 3a consists of a gold-germanium alloy layer 31 having a thickness of 500 angstroms, a nickel layer 32 having a thickness of 100 angstroms, and a gold layer 33 having a thickness of 1000 angstroms. The drain electrode 3b is formed similarly. A gate electrode 4 is formed within the opening 11a on the channel layer 10. As shown in FIG. 1(c), the gate electrode 4 is disposed on the channel layer 10, and comprises a titanium layer 41 formed on the channel layer 10, a platinum layer 42 on the titanium layer 41, and a gold layer 43 on the platinum layer 42. The titanium layer 41 is 1000 angstroms thick and forms a Schottky barrier with the channel layer 10. The platinum layer 42 is 1000 angstroms thick. The gold layer 43 is 3000 angstroms thick.

Figure 2A:
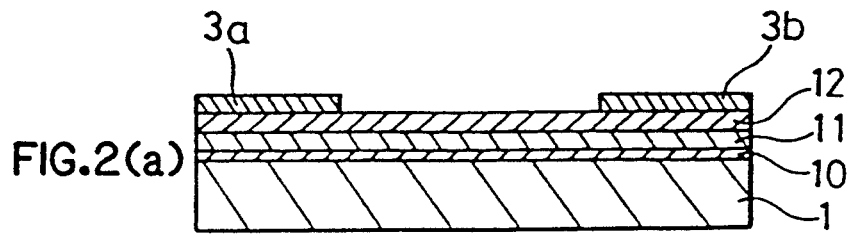
FIGS. 2(a)-2(d) are cross-sectional views illustrating the steps performed to create a recess in the MESFET shown in FIGS. 1(a)-1(c) by forming two holes on different levels.

The fabrication method is now described. First, as shown in FIG. 2(a), the n-type GaAs layer is formed as the channel layer 10 on the GaAs substrate 1. The n+-type AlGaAs layer is grown as the lower semiconductor layer 11 to be recessed on the channel layer 10. Then, the n+-type GaAs layer is formed as the upper semiconductor layer 12 to be recessed on the lower semiconductor layer 11. These semiconductor layers are formed by MBE (molecular beam epitaxy), MOCVD (metal organic chemical vapor deposition), or another method.

A resist film (not shown) is then deposited on the upper semiconductor layer 12. Openings (not shown) are formed at the locations where source and drain electrodes are to be formed. A Au-Ge alloy layer 31, a Ni layer 32, and a Au layer 33 are formed to given thicknesses over the whole surface of the laminate by evaporation. Unwanted portions of these layers are removed by the lift-off technique. The laminate is thermally treated at a temperature of 400 C. for about 5 minutes. Thus, the source electrode 3a and the drain electrode 3b are produced.

Figure 2B:
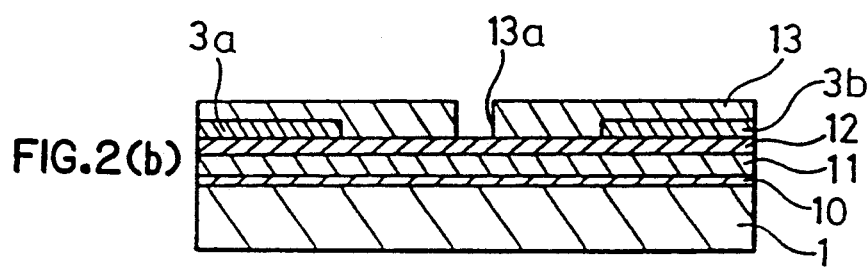

Then, the resist film 13 is formed over the whole surface of the laminate. An opening 13a is formed in the region between the source electrode 3a and the drain electrode 3b. The gate electrode is to be formed in this region (FIG. 2(b)). At this time, the width of the opening 13a is substantially equal to the width of the lower portion of the double recess 20.

The laminate including the GaAs substrate 1 is immersed in an etchant which etches GaAs at a high rate but etches AlGaAs at a low rate. As an example, a liquid mixture consisting of 1 part of NH$_4$OH water solution of a concentration of 30% and 30 parts of H$_2$O$_2$ water solution of a concentration of 30% is used as the etchant.

Figure 2C:
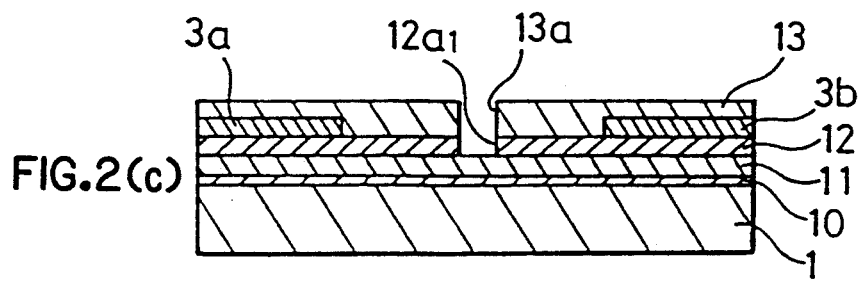
Figure 2D:
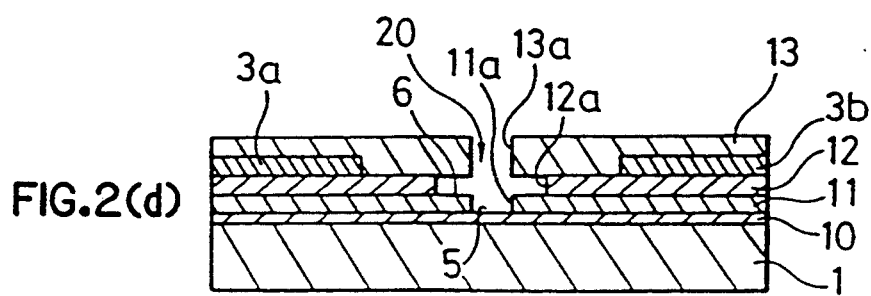

When the laminate is immersed in the etchant in this way, the exposed portion of the n+-type GaAs layer 12 is first etched away, thus forming an opening 12a$_1$ (FIG. 2(c)). Then, etching of the lower n+-type AlGaAs layer 11 is started. At this time, the GaAs layer 12 is etched at a rate 10 times as fast as the rate at which the AlGaAs layer 11 is etched. Therefore, lateral etching proceeds quickly in the GaAs layer 12 overlying the AlGaAs layer 11 while etching proceeds downward in the layer 11. Consequently, when the opening 11a is completed in the lower semiconductor layer 11 to be recessed, the opening 12a$_1$ in the upper semiconductor layer 12 to be recessed grows into the wider opening 12a. As shown in FIG. 2(d), the double recess 20 is obtained in this way.

Figure 3A:
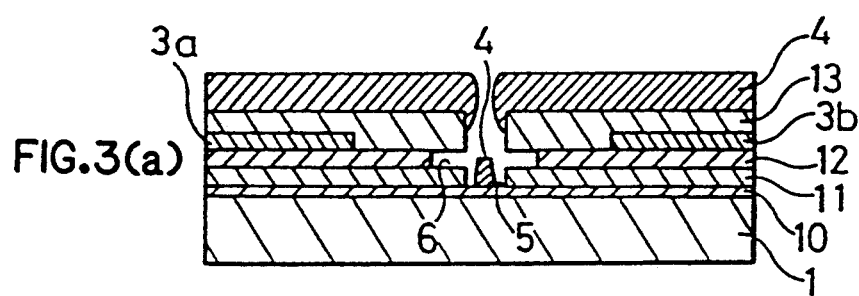
Figure 3B:
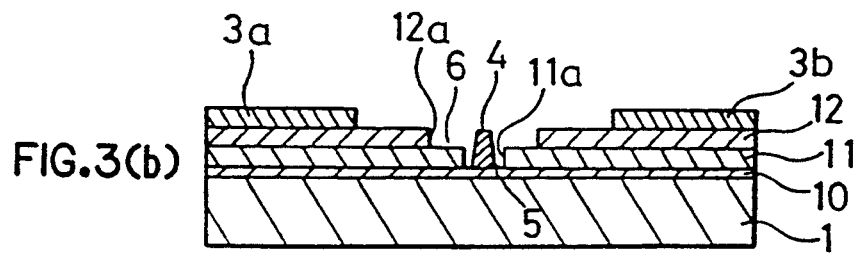

Subsequently, Ti layer 31, Pt layer 32, and Au layer 33 are successively deposited over the whole surface of the resist film 13 by evaporation (FIG. 3(a)). Those portions of the layers which do not form the gate electrode are removed by the lift-off technique. In this manner, the desired FET having the doubly recessed gate structure is completed (FIG. 3(b)).

In the present example, the lower semiconductor layer 11 to be recessed and the upper semiconductor layer 12 to be recessed are formed successively on the substrate. The upper layer 12 is etched at a higher rate than the lower layer 11. These two layers are etched, using the resist pattern 13 having the opening 13a at a given position as a mask. Therefore, when the recesses are formed by etching, the upper semiconductor layer 12 is etched faster than the lower semiconductor layer 11. Hence, after the opening 12a$_1$, has been formed in the upper semiconductor layer 12, lateral etching in the opening 12a$_1$ proceeds faster than vertical etching in the lower semiconductor layer 11. In consequence, the doubly recessed structure is obtained in one recess etching step and in one etching step. Also, it is ensured that the second recess is nested in the first recess. Furthermore, only one mask is needed to obtain the second recess, the mask having the opening corresponding to the secondly recessed region, because the etch rate of the upper etched region is higher than that of the lower etched region. Hence, no extra mask is required, unlike in the method described in the above-cited Japanese Patent Publication No. 1-223771. As a result, the doubly recessed structure can be manufactured with a high yield in a short time at a lower cost.

The materials of the gate electrode are deposited on the resist pattern 13 used when the double recess was formed. Unwanted portions of these materials are lifted off and removed to form the gate electrode 4 and, therefore, no mask pattern is necessary to form the gate electrode. Additionally, the gate electrode can be accurately formed within the recess.

Because the gate electrode consists of the three layers of Ti, Pt, and Au, and because the lowermost layer is made of titanium, the whole gate electrode is firmly bonded to the substrate. Since the intermediate layer is made of platinum, diffusion of Au from the overlying Au layer into the substrate and diffusion of Ga and As from the GaAs substrate into the Au layer is prevented.

Each of the source electrode 3a and the drain electrode 3b consists of three layers made of a Au-Ge alloy, Ni, and Au, respectively. The lowermost layer is made of the Au-Ge alloy. Thermal processing is performed after the formation of the electrodes. Germanium in the lowermost layer diffuses into the semiconductor layer, creating a highly doped diffusion layer in the semiconductor layer immediately beneath the electrodes. For this reason, good ohmic contact is made. In addition, the diffusion of Ge is made homogeneous, since the Ni layer is formed on the Au-Ge alloy layer.

The GaAs layer 10 in which electrons move at a higher speed than in the AlGaAs layer 11 is formed as an operating layer between the recessed lower AlGaAs layer 11 and the substrate 1 and, therefore, a device operating at a high speed is realized.

In the above example, the lower of the two recessed layers comprises GaAs, while the higher layer comprises AlGaAs. Other combinations of materials are also possible. For instance, a combination of GaAs and InGaAs and a combination of GaAs and InP are feasible. In these cases, a liquid mixture consisting of 5 parts of 50% water solution of tartaric acid and 1 part of 30% water solution of $H_2O_2$ is used as the etchant.

Also in the above example, the recesses are formed by wet etching. Dry etching can also be exploited. For example, $CClF_2$ gas can be used for the combination of GaAs and AlGaAs.

In the example described already, the $n^+$-type GaAs layer is created as the active layer between the recessed semiconductor layer 11 and the substrate 1. When the semiconductor layer 11 is made of a material in which electrons move at a sufficiently high speed, or when the operating speed is of no great concern, the semiconductor layer 11 may be used as the active layer.

Figure 4:
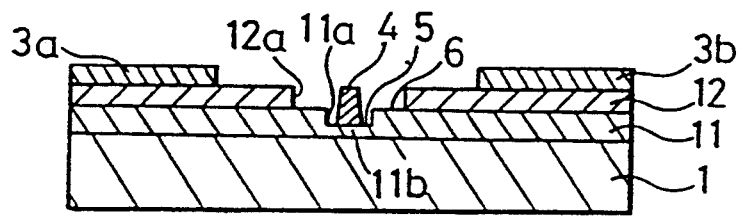
FIG. 4 is a cross-sectional view of a MESFET fabricated by another method according to the invention, the MESFET having a doubly recessed gate structure.

Referring next to FIG. 4, there is shown another MESFET fabricated in accordance with the invention. This semiconductor device is similar to the device already described in connection with FIGS. 1(a)-1(d), 2(a)-2(d), 3(a)-3(b) except that the active layer 10 is not used but the recessed semiconductor layer 11 is used as an active layer. When the first recess 5 is formed, the semiconductor layer 11 is not fully etched away but a channel portion 11b is left under the gate electrode 4.

In this example, the step for growing the active layer 10 can be omitted. In this case, the device can be manufactured in a shorter time.

In the above examples, the recessed structure has two recesses formed on different levels. The recessed structure may also have three or more recesses formed on different levels.

Figure 5:
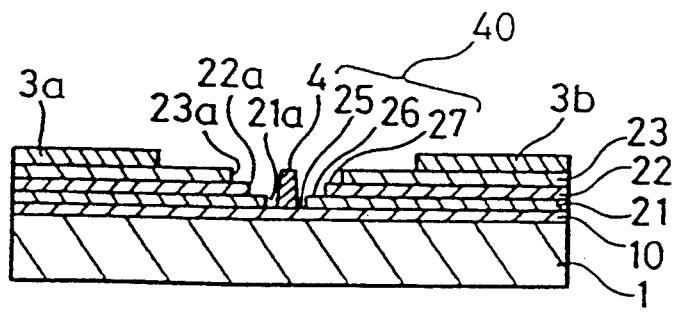
FIG. 5 is a cross-sectional view of a MESFET fabricated by a further method according to the invention, the MESFET having a triply recessed gate structure.

Referring to FIG. 5, there is shown a further MESFET fabricated in accordance with the invention, the FET having a triply recessed structure. This device is similar to the device described first except for the following points. A first semiconductor layer 21, a second semiconductor layer 22, and a third semiconductor layer 23 are produced on the active layer 10. Recesses are created in these three layers 21-23. Each of these three layers is made of $Al_xGa_{1-x}As$. In these three layers, the ratio X is $X_{21}$, $X_{22}$, $X_{23}$, respectively. The ratios are set so that $X_{21} < X_{22} < X_{23}$ and the relative etching rates of the layers have the same relationship. A first opening 21a, a second opening 22a, and a third opening 23a are formed in the semiconductor layers 21-23, respectively. The opening in the lower layer has the larger area. These openings 21a-23a form a first recess 25, a second recess 26, and a third recess 27, thus creating a triply recessed structure 40. This device is manufactured by a method similar to the method of fabricating the first example except that the three layers 21a-23a of different compositions $Al_xGa_{1-x}As$, where X is different for each different layer, are successively grown in the step of FIG. 1(a). In this case, the compositions of the semiconductor layers 21-23 are so determined that the upper layer is etched at the higher rate. This device yields the same advantages as does the example described first. In addition, the overall recess can be nearly conical in shape, which is empirically recognized as providing the best power efficiency.

Figure 6:
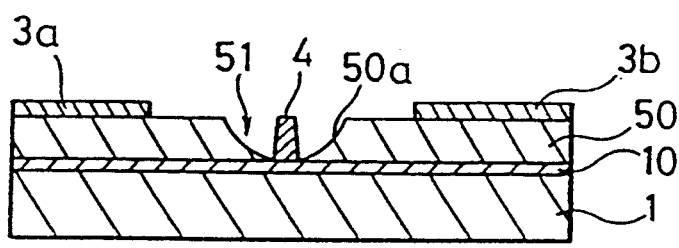
FIG. 6 is a cross-sectional view of a MESFET fabricated by a yet other method according to the invention, the MESFET having a structure provided with a conical recess.

Referring to FIG. 6, there is shown a yet other MESFET fabricated in accordance with the invention. This device is similar to the device described first except that a semiconductor layer 50 is formed on the GaAs active layer 10 and that the semiconductor layer 50 is provided with a recess 50a. The semiconductor layer 50 is made of a material $Al_xGa_{1-x}As$, and the ratio X decreases continuously from the lower surface adjacent to the layer 10 the upper surface adjacent to the source and drain electrodes 3a and 3b. The fabrication method differs from the method described in the first example only in that the layer of the composition $Al_xGa_{1-x}As$ is formed while continuously decreasing the ratio X in the step of FIG. 1(a), and that the etch rate increases continuously from the lower surface to the upper surface.

In this example, the etch rate of the semiconductor layer to be recessed decreases with depth, i.e., toward the substrate 1. Therefore, this layer can be made to have a conical recess 51 that is recognized as offering the best power efficiency, by selectively etching the semiconductor layer, using a given mask pattern.

In the above examples, the recessed gate structure is applied to MESFETs. This structure can also be applied with equal utility to a high-electron-mobility transistor (HEMT).

Figure 7:
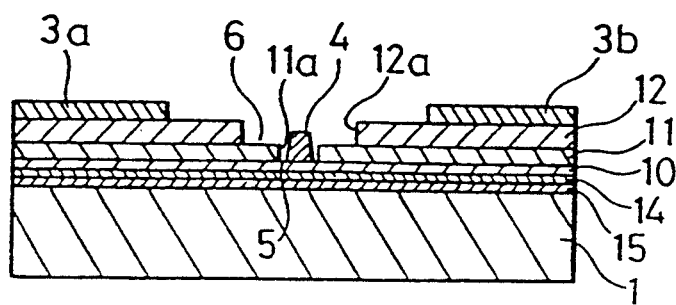
FIG. 7 is a cross-sectional view of a HEMT fabricated by a still another method according to the invention, the HEMT having a doubly recessed gate structure.
Figure 8:
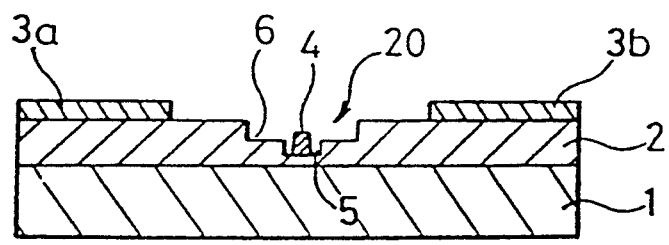
FIG. 8 is a cross-sectional view of the prior art MESFET of the doubly recessed gate structure.
Figure 11:
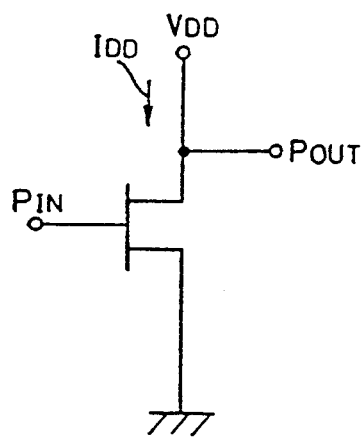
FIG. 11 is a circuit diagram illustrating the advantage of the doubly recessed gate structure of a MESFET.
Figure 9A:
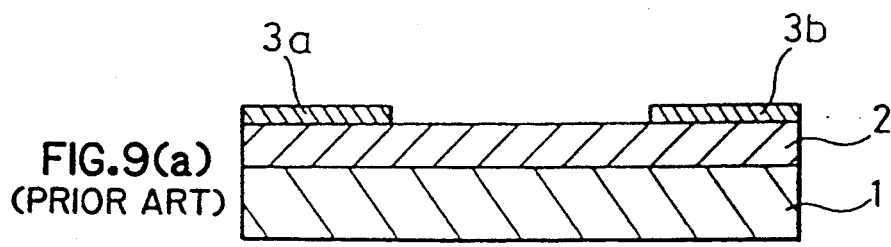
FIGS. 9(a)-9(e) are cross-sectional views illustrating the steps performed to create recesses on two different levels in the prior art MESFET shown in FIG. 8.
Figure 9B:
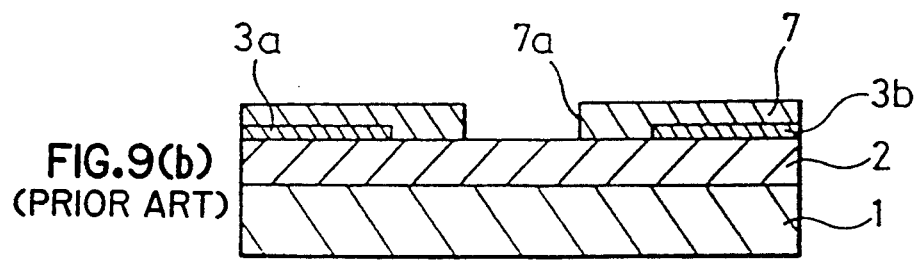
Figure 9C:
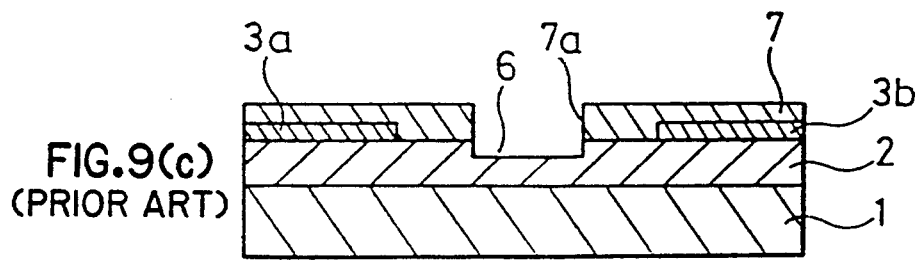
Figure 9D:
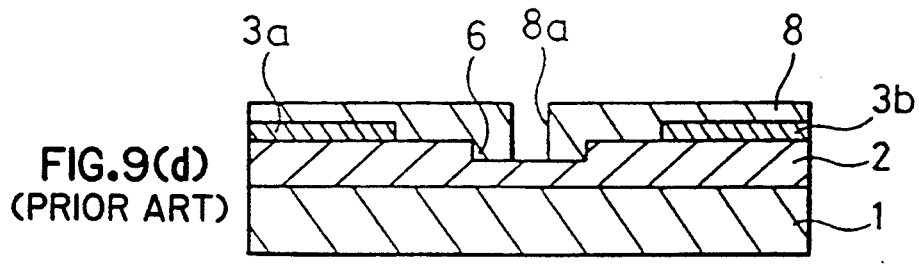
Figure 9E:
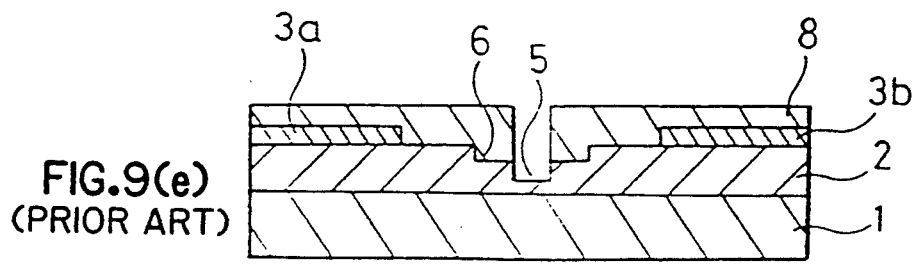
Figure 10A:
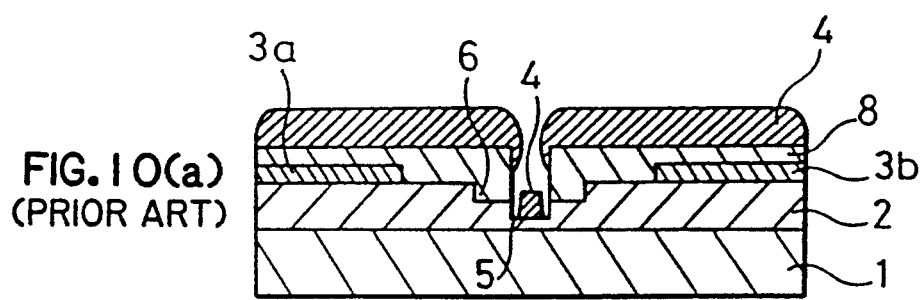
FIGS. 10(a)-10(b) are cross-sectional views illustrating the steps performed to create a gate electrode in the prior art MESFET shown in FIG. 8.
Figure 10B:
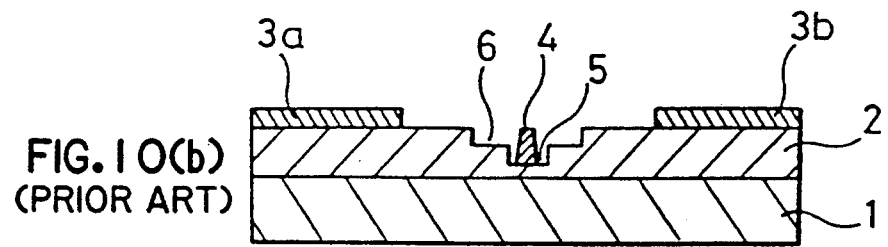

Referring next to FIG. 7, there is shown a HEMT having a doubly recessed gate structure according to the invention. This device is similar to the device described first except that an n-type AlGaAs layer 14 supplying electrons is formed between the GaAs active layer 10 and the substrate 1, and that an undoped GaAs layer 15 serving as a secondary electron gas layer is formed under the layer 14.

As described thus far, in the novel method of fabricating a semiconductor device, a semiconductor layer in which the etch rate decreases with depth is formed on a semiconductor substrate and then selectively etched, using a resist mask. Therefore, a recess consisting of a wider upper portion and a narrower lower portion can be made in one lithography step and in one etching step without an extra mask fabrication step. Hence, productivity can be improved.

In accordance with the invention, a first semiconductor layer of a low etch rate is formed on a semiconductor substrate. A second semiconductor layer of a higher etch rate is formed on the first semiconductor layer. These two semiconductor layers are selectively etched to produce a doubly etched structure. This structure can be fabricated in one lithography step. Also, the nesting of recesses on different levels is effected by making use of their self-aligning characteristics. Since the region recessed first is etched at a higher rate than the region recessed next, only one mask having an opening corresponding to the feature of the secondly recessed region is needed to obtain the doubly recessed structure; no extra mask is necessary. This results in an improvement in the manufacturing yield. Also, the time taken to manufacture the device is shortened. Consequently, the manufacturing cost can be reduced.

Also, in accordance with the invention, three or more semiconductor layers are grown on a semiconductor substrate such that the lower layer is etched at the lower rate. These semiconductor layers are etched, using a given resist mask. Hence, a multi-recessed structure having a nearly conical form which is recognized as providing the best power efficiency can be easily created.

Moreover, in accordance with the invention, a semiconductor layer in which the etch rate increases continuously from a lower surface adjacent to a substrate to an upper surface is formed on a semiconductor substrate. This semiconductor layer is etched, using a given resist mask. As such, a recessed structure having an almost conical shape which is recognized as providing the best power efficiency can be easily formed.

What is claimed is:

1. A method of fabricating a field-effect transistor on a semiconductor substrate comprising the steps of:
   successively forming directly on a GaAs substrate an InGaAs film having a first etch rate and a GaAs film having a second etch rate, faster than the first etch rate, on said InGaAs film;
   forming a resist film having an opening in a selected location on said GaAs film;
   etching said GaAs and InGaAs films with an aqueous solution of tartaric acid and hydrogen peroxide, using said resist film as a mask, to form a two-stage concave recess extending through said GaAs film and into said InGaAs film; and
   forming a gate electrode in the recess on said InGaAs film.

2. The method of claim 1 including forming said gate electrode by successively depositing titanium, platinum, and gold on said GaAs film.

3. The method of claim 1 including forming source and drain electrodes on opposite sides of the recess by successively depositing on said GaAs film a gold-germanium alloy, and gold.

4. The method of claim 1 wherein said gate electrode forms a Schottky barrier with said InGaAs film.

5. The method of claim 1 including forming said gate electrode using said resist film as a mask.

6. The method of claim 5 including forming said gate electrode by successively forming a titanium layer, a platinum layer, and a gold layer on said resist film and in said recess and removing said resist film and the titanium, platinum, and gold layers on said resist film by the lift-off technique.

7. The method of claim 1 including forming said InGaAs and second GaAs films by one of MOCVD (metal organic chemical vapor deposition) and MBE (molecular beam epitaxy).

8. A method of fabricating a field-effect transistor on a semiconductor substrate comprising the steps of:
   successively forming directly on a GaAs substrate an InP film having a first etch rate and a GaAs film having a second etch rate, faster than the first etch rate, on said InP film;
   forming a resist film having an opening in a selected location on said GaAs film;
   etching said GaAs and InP films with an aqueous solution of tartaric acid and hydrogen peroxide, using said resist film as a mask, to form a two-stage concave recess extending through said GaAs film and into said InP film; and
   forming a gate electrode in the recess on said InP film.

9. The method of claim 8 including forming said gate electrode by successively depositing titanium, platinum, and gold on said GaAs film.

10. The method of claim 8 including forming source and drain electrodes on opposite sides of the recess by successively depositing on said GaAs film a gold-germanium alloy, nickel, and gold.

11. The method of claim 8 wherein said gate electrode forms a Schottky barrier with said InP film.

12. The method of claim 9 including forming said InP and GaAs films by one of MOCVD (metal organic chemical vapor deposition) and MBE (molecular beam epitaxy).

* * * * *

UNITED STATES PATENT AND TRADEMARK OFFICE
CERTIFICATE OF CORRECTION

PATENT NO. : 5,270,228
DATED : December 14, 1993
INVENTOR(S) : Takahide Ishikawa It is certified that error appears in the above-indentified patent and that said Letters Patent is hereby corrected as shown below:

Col. 10, line 2, after "alloy," insert --nickel,--.

Signed and Sealed this

Fifth Day of July, 1994

Attest:

BRUCE LEHMAN

Attesting Officer     Commissioner of Patents and Trademarks